United States Patent
O'Leary et al.

(10) Patent No.: US 6,781,383 B2
(45) Date of Patent: Aug. 24, 2004

(54) METHOD FOR FAULT DETECTION IN A PLASMA PROCESS

(75) Inventors: Kevin O'Leary, Lucan (IE); John Scanlan, Waterford (IE); Ciaran O'Morain, Palmerstown (IE)

(73) Assignee: Scientific System Research Limited, Kilbarrack (IE)

(*) Notice: Subject to any disclaimer, the term of this patent is extended or adjusted under 35 U.S.C. 154(b) by 0 days.

(21) Appl. No.: 10/295,350

(22) Filed: Nov. 15, 2002

(65) Prior Publication Data

US 2004/0055868 A1 Mar. 25, 2004

(30) Foreign Application Priority Data

Sep. 24, 2002 (IE) .......................................... 2002/0773

(51) Int. Cl.$^7$ ............................................. G01N 27/62
(52) U.S. Cl. ....................................................... 324/459
(58) Field of Search ................................. 324/459, 464, 324/111.21, 70, 705, 111.51, 111.71; 438/5, 7, 9, 10; 204/192.13, 192.33, 400, 401

(56) References Cited

U.S. PATENT DOCUMENTS

| | | | |
|---|---|---|---|
| 5,479,340 A | 12/1995 | Fox et al. | |
| 5,576,629 A | 11/1996 | Turner et al. | |
| 5,808,415 A | 9/1998 | Hopkins | |
| 6,441,620 B1 * | 8/2002 | Scanlan et al. | ............. 324/459 |

* cited by examiner

*Primary Examiner*—Evan Pert
(74) *Attorney, Agent, or Firm*—Alston & Bird LLP (57) ABSTRACT

A method of fault detection is described for use in a plasma process chamber powered by an RF source and subject to periodic standard preventive maintenance. Prior to a production run, the changes in magnitude of a plurality of Fourier components of the RF source resulting from known changes in a plurality of process conditions are determined and a single parameter which is a linear combination of a selected subset of said components is constructed. The construction is such that the combination is relatively sensitive to pre-selected process changes and relatively insensitive to said standard preventive maintenance. Then, during the production run, the single parameter is monitored to determine if there is a fault in the plasma process.

6 Claims, 10 Drawing Sheets

Fig. 1

| Wafer | Process Input |
|---|---|
| 1 | Nominal |
| 2 | Nominal |
| 3 | Coil power −10% |
| 4 | Coil power −5% |
| 5 | Coil power +5% |
| 6 | Coil power +10% |
| 7 | Bias power −10% |
| 8 | Bias power −5% |
| 9 | Bias power +5% |
| 10 | Bias power +10% |
| 11 | Pressure +40% |
| 12 | Pressure +20% |
| 13 | Pressure −20% |

|       | I0     | I1     | I2     | I3     | I4     | V0      | V1     | V2     |
|-------|--------|--------|--------|--------|--------|---------|--------|--------|
| LP    | 24.117 | 8.490  | -6.602 | 11.031 |        | 29.105  | 18.800 | 35.787 |
| UP    | -5.818 | 2.234  | 9.683  | -7.967 | -6.125 | -11.871 | 10.862 | 1.613  |
| P     | 6.944  |        | 3.081  | 6.128  |        | 4.093   |        | 7.040  |
| UP*LP | -1.783 | -3.083 | 2.729  | 12.870 | 5.250  | -2.732  | -1.253 | -2.347 |
| P*LP  | 0.938  |        | -3.037 |        |        | 1.893   | -1.337 |        |
| P*UP  | 1.220  |        | 1.188  |        |        |         | 3.593  | 3.520  |
| P*LP*UP |      |        | 1.188  |        |        |         |        |        |

|       | V3      | V4      | Φ0     | Φ1     | Φ2     | Φ3     | Φ4     |
|-------|---------|---------|--------|--------|--------|--------|--------|
| LP    | 28.407  | 49.567  | 0.923  | -2.415 | 1.194  | -2.930 |        |
| UP    | 21.242  | -15.251 | -0.856 | 0.694  | -0.829 | -0.767 | 2.017  |
| P     |         | 19.319  | 0.720  | -1.028 | 0.373  | -1.438 |        |
| UP*LP | -25.923 | -15.251 |        | -1.707 | 0.347  | 1.079  | -3.717 |
| P*LP  |         | 4.982   |        | 0.851  |        |        |        |
| P*UP  |         |         |        |        | 0.449  | -0.334 |        |
| P*LP*UP |       |         |        |        | 0.241  |        |        |

LP = Lower Power, UP = Upper Power, P = Pressure

METHOD FOR FAULT DETECTION IN A PLASMA PROCESS

BACKGROUND OF THE INVENTION

1. Field of the Invention

The present invention relates to a method of fault detection in a plasma process chamber powered by an RF source.

2. Prior Art

Plasma processing of materials is used in a large number of industrial applications, which include the manufacture of semiconductor devices, flat panel displays, optical components, magnetic storage devices and many more. These plasma processes include the deposition and etching of dielectrics, conductors and semiconductors on a substrate, for example, a silicon wafer. The plasma process usually involves placing the substrate in a vacuum chamber, introducing process gases and applying radio-frequency (RF) power, typically 0.1 to 200 MHz, to create a plasma. The plasma consists of ions, electrons, radical gas species and neutral gas, all of which permit the desired reaction to proceed. The plasma reaction has many inputs, including RF power, gas flows, chamber pressure, substrate and wall temperatures, chamber wall conditions, electrode spacing and so on.

Control of the complex plasma process is the key to improved manufacturing, i.e. to have accurate and repeatable processing the plasma itself should be repeatable. Unfortunately there are few schemes in existence for direct plasma process monitoring and control. It is more usual to monitor or control gas flow, power output from RF generator, chamber pressure or temperature, etc., i.e. the process inputs. However, since the plasma process depends directly on the plasma parameters, measuring these indirect variables is generally not sufficient.

Very often the control scheme employed in, for example, semiconductor manufacturing relies on Statistical Process Control (SPC), whereby many if not all of the process inputs are recorded and control charts are monitored for out-of-control events. It has been, noted many times in the industry that monitoring all these control screens is both problematic and undependable. Inputs can stray outside control limits, with no apparent effect on the process output (i.e. a false positive) and/or process inputs can remain within control limits but process output can drift out-of-control (due to changes in the process conditions).

Improvements in fault detection can lead to greater manufacturing efficiency by detecting problems in a timely manner and reducing yield loss. When the fault is detected the process is terminated and the problem is then fixed.

There is a need to improve the methods for monitoring and controlling plasma assisted manufacturing. In particular improved techniques for fault detection are needed.

The plasma represents a non-linear complex load in electrical terms. This results in distortion of the fundamental RF driving signal. Using a Fourier Transform, the RF signal can be separated into its Fourier components. It is generally accepted that monitoring the Fourier components of the RF power signal provides a useful way to monitor the plasma process. These components are a more direct measurement of the plasma process since they are more directly related to fundamental plasma parameters.

It is known to use an RF sensor to monitor and control RF plasmas by measuring the Fourier components of voltage, current and phase. The sensor can be used in closed or open loop control, as for example, in etch end-point control or as in-situ monitoring of the plasma process. In either case the plasma can be terminated when one or more of the Fourier components reaches pre-determined limits.

U.S. Pat. No. 5,576,629 describes a method for plasma fault detection using a standard SPC approach to monitoring RF components. This approach has a fundamental limitation; namely, only the variance of the individual RF components is considered. This gives rise to several problems. Firstly, there is no indication of which RF components should be monitored. Without this the user is faced with more control charts to monitor. Secondly, the RF components are very sensitive to all process variations, hence their suitability for process control. However, it is found that events such as tool maintenance and normal chamber conditions drift (such as layer formation during normal lifetime) make SPC control using RF components very difficult. Chamber condition drift means the SPC limits need to be dynamic and must be learned in advance.

Figure 1:
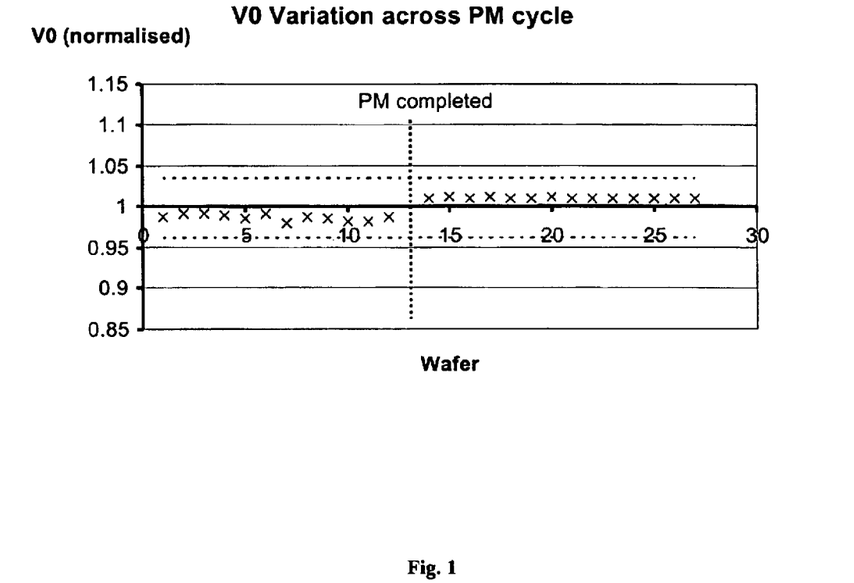
FIG. 1 shows the variation of fundamental voltage across a PM cycle with SPC limits.

For example, consider FIG. 1 which shows a plot of the normalised fundamental voltage V0 recorded before and after a preventative maintenance (PM) event as successive wafers (or wafer batches) are processed. The V0 parameter shows a significant change after the PM. Control limits are calculated from the set of data using the 3-sigma rule and are shown as parallel dashed lines. The change in the nominal value of V0 after the PM necessitates the broadening of the control limits. This is the limitation of applying the classical SPC technique to the RF components.

Figure 2:
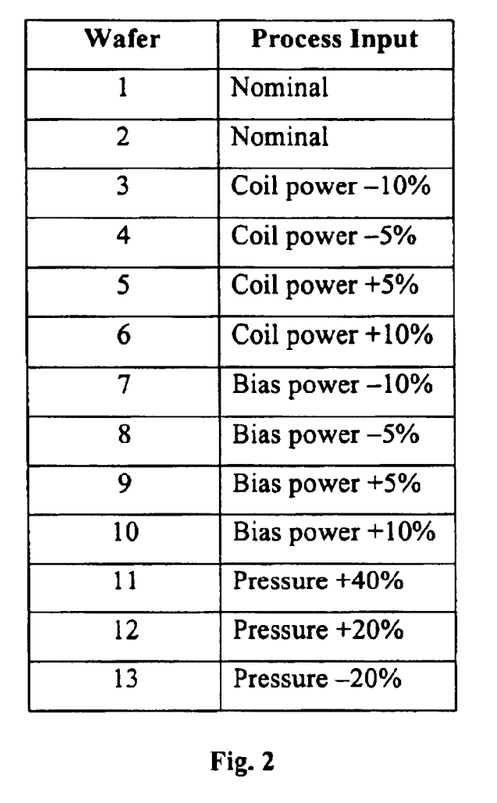
FIG. 2 is a table describing an experiment of induced fault conditions.

FIG. 2 is a table showing an experiment where three process input settings of a semiconductor wafer process are varied in turn to replicate possible faults that may occur in a plasma process chamber. The first two wafers are carried out with all process input settings at their nominal set-point. For subsequent wafers, coil generator power, bias generator power and chamber pressure are each varied by the amount shown in the table.

Figure 3:
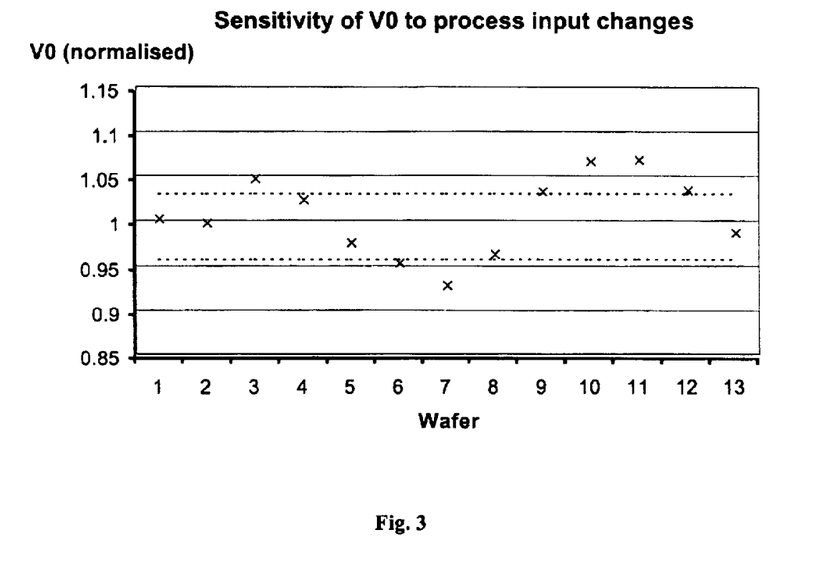
FIG. 3 shows the sensitivity of the fundamental voltage to the induced faults.

FIG. 3 shows a plot of V0 during the experiment. As expected, the nominal data-points are in control; however six of the fault conditions are also within the control limits, and therefore not detectable. Tool maintenance often requires chamber hardware rebuilds, which has the effect of changing measured RE components dramatically, meaning old SPC limits cannot be reapplied.

For this reason, multivariate statistical techniques have often been used in an attempt to offset these problems. Multivariate techniques take into account not only the individual variance of the control parameters, but also their covariance. This addresses some of the shortfalls of SPC techniques in that the multivariate statistic can be used to compress the data and thus reduce the number of control charts. Also, by including the covariance, problems with data drift can be countered, since the fault alarm now depends not only on how any individual parameter changes but also how they change together. Using these techniques the number of false positives and the number of missed faults have been shown to be greatly reduced.

U.S. Pat. No. 5,479,340 shows a method of applying multivariate statistics to plasma control using inputs from an RF sensor. The technique takes all RF sensor data and compresses to a single Hotelling $T^2$ statistic. This single statistic is then used for fault detection. A problem with the method as described is that all data is assigned equal significance. The variance and covariance of all parameters are used in the construction of the statistic. There is no way to determine which parameters are meaningful to collect, resulting in a large amount of redundant data being processed. This introduces unnecessary noise and results in broader process control limits. For example, in the case of the preventative maintenance event shown in FIG. 1, the global multivariate approach will learn how the SPC limits typically jump from PM to PM and widen the SPC limits accordingly.

Therefore, there is a need to develop a fault-detection technique that is sensitive to fault conditions, but not to the normal changes that occur in a chamber after a preventive maintenance.

SUMMARY OF THE INVENTION

Accordingly, the present invention provides a method of fault detection in a plasma process chamber powered by an RF source and subject to periodic standard preventive maintenance events, comprising the steps of:

prior to a production run using a predetermined plasma process, determining the changes in magnitude of a plurality of Fourier components of the RF source resulting from known changes in a plurality of process conditions and constructing a single parameter which is a linear combination of a selected subset of said components, said combination being relatively sensitive to pre-selected process changes and relatively insensitive to said standard preventive maintenance events, running the plasma process during a subsequent production run, and during said production run, monitoring said single parameter to determine if there is a fault in the plasma process.

The invention provides a technique for real-time fault detection. The key is the application of a knowledge base prior to data compression. Data compression is not based on statistical techniques but rather on optimisation of sensitivity to pre-selected process conditions.

BRIEF DESCRIPTION OF THE DRAWINGS

An embodiment of the invention will now be described, by way of example, with reference to the accompanying drawings, in which.

DETAILED DESCRIPTION OF A PREFERRED EMBODIMENT

Figure 4:
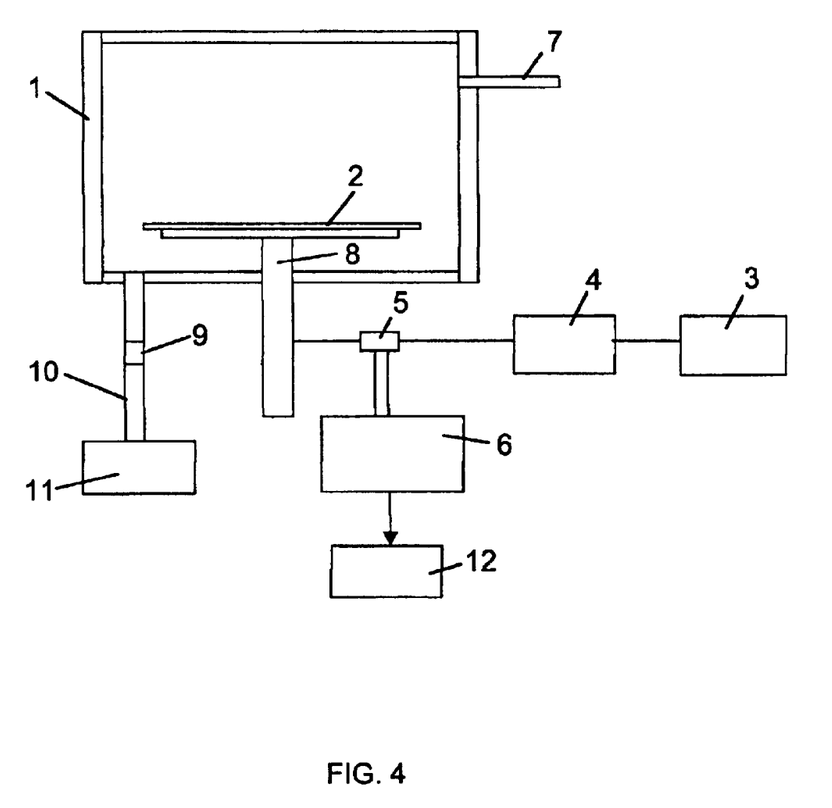
FIG. 4 depicts a typical plasma process chamber.

FIG. 4 shows a typical plasma process chamber. It includes a plasma chamber 1 containing a wafer or substrate 2 to be processed. A plasma is established and maintained within the chamber by an RF power source 3. This source generally has real impedance which must undergo a transformation to match that of the complex plasma load. This is done via match network 4. Power is coupled to the plasma chamber, typically by capacitive or inductive coupling, through an electrode 8. Process gases are admitted through gas inlet 7 and the chamber is maintained at a desirable pressure by pumping through gas exhaust line 10 using pump 11. A throttle valve 9 may be used to control pressure. The plasma permits effective manufacture of for example, semiconductor devices, by changing gas chemistry. Gases such as $Cl_2$, used to etch silicon and metal, for example, are converted into reactive and ionised species. Etching of the very fine geometry used to fabricate semiconductor devices is made possible by the reactive gases, ions and electrons of the plasma.

The wafer is processed according to some recipe, which is controlled by the tool operator. This recipe includes input parameter settings such as process gas flow rates, chamber pressure, substrate/wall temperatures, RF power settings on one or more power generators, recipe time, inter-electrode spacing, etc. This is the case for all plasma processing tools, such as etch, deposition, etc. The wafer will undergo very many plasma process steps before completion. Each step contributes to the overall product yield; a fault at any one step may destroy potential product.

Referring again to FIG. 4, an RF sensor 5 is used to measure the RF electrical power signal in the complex post-match electrical line. A Fourier Transform is performed in data collection electronics 6 using a sampling technique which extracts the Fourier components of the voltage and current and the phase angle between these vectors. This data sampling should have sufficiently high resolution to determine the Fourier components across a very large dynamic range. Suitable techniques for high resolution sampling and measurement of the Fourier components are described in U.S. Pat. No. 5,808,415.

These Fourier components are very sensitive to plasma events. The wafer fabrication process involves running entire batches of wafers with similar plasma process recipes to ensure reliable volume production. If the plasma process on each wafer is the same, then the measured Fourier components will reflect this. Any change in the plasma process will be registered by change(s) in the Fourier components.

The output of the data collection electronics 6 is connected to a controller 12 which may be a computer or other system which uses the signals to yield information about and/or control the plasma process.

In the embodiment of the invention now to be described the controller 12 builds a composite single parameter, referred to herein as a "health index", which is particularly sensitive to faults of interest but insensitive to PM events.

Figure 5:
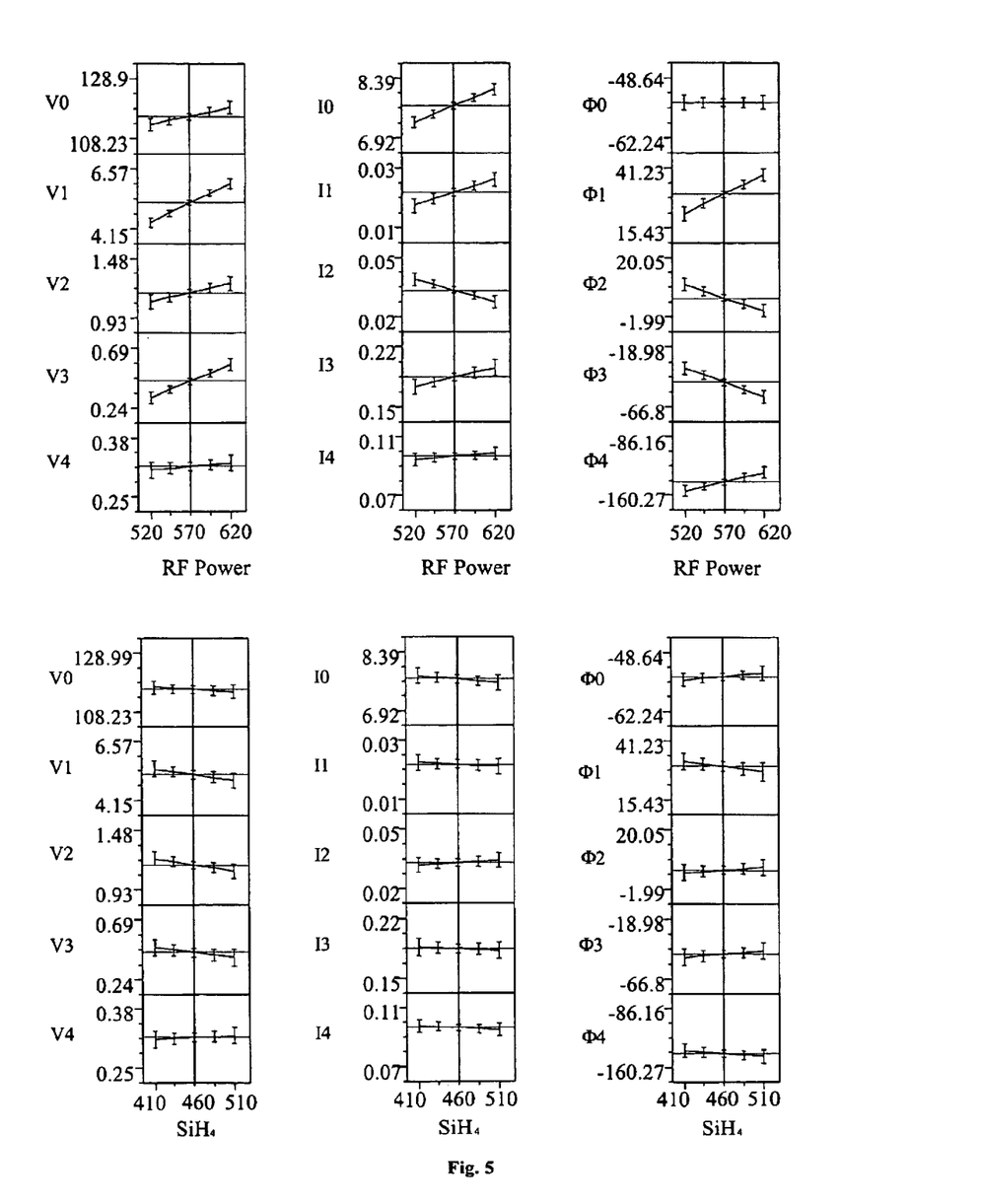
FIG. 5 shows a set of design of experiments (DOE) response data set taken with an RF sensor on a plasma chamber.

FIG. 5 shows data derived from a so-called Design of Experiments (DOE) run on a Plasma Enhanced Chemical Vapour Deposition tool. The data is from a 3-level, 5-factor Box-Behnken Surface Response run. The full data from the DOE depicts the predicted changes in magnitude of, in this example, 15 Fourier components as a function of variations in five process input parameters. FIG. 5 shows the data relating to two of such input variables, $SiH_4$ concentration and RF power. Varying any one of the process input parameters results in a unique and repeatable pattern of changes in the Fourier components.

In the use of the above technique for identifying faults in a production run a DOE is run prior to the production run. This determines the changes in magnitude of the aforesaid fifteen Fourier components as a function of changes in a plurality of the process input parameters. The DOE data is stored for reference and can be regarded as a "fingerprint" of the particular plasma process. In addition to learning the changes in Fourier components from the changes in the plurality of process inputs, other changes, representing typical fault conditions, are induced. For example, the integrity of the hardware and process can be deliberately compromised so that these fingerprints are recorded and included in the fingerprint data. Examples might be induced air leak, omission of or mis-fitting of hardware components, wafer mis-placement and so on.

From the DOE and these induced fault conditions, it becomes apparent which of the Fourier components are sensitive to faults for a given process or process chamber configuration. For example, we have noted that certain Fourier components are unresponsive to process and/or hardware changes under certain conditions while in another process or process tool the same Fourier components are highly responsive. Looking at FIG. 5, for example, it can be seen that V4, I4 and Φ have low responses to the change in SiH4 concentration relative to the signal variance. Therefore, none of these are useful for the detection of faults arising from changes in SiH4 concentration.

Figure 6:
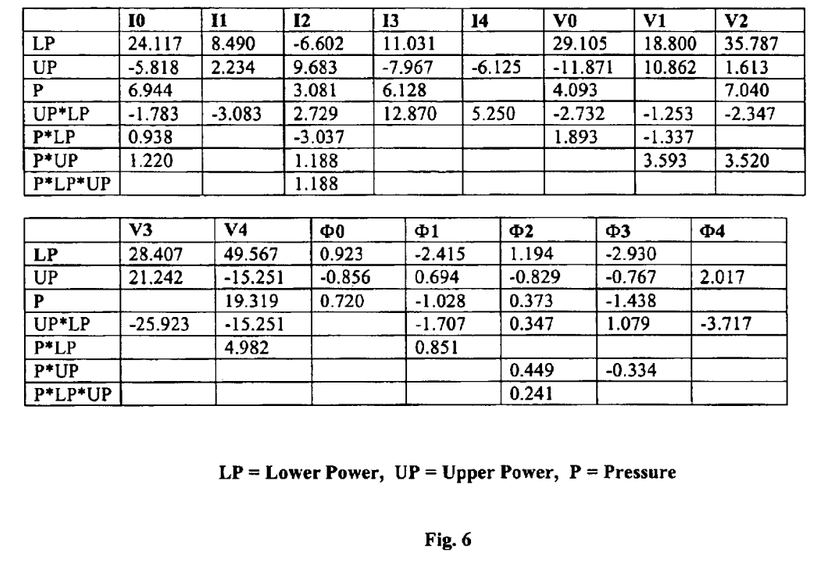
FIG. 6 is a DOE effects table for the changes in a selection of Fourier components with changes in a selection of process input parameters.

All the data from the DOE, that includes hardware and process variations, is compiled in an effects table, as shown in FIG. 6.

A pattern-recognition technique called Feature Selection is then applied to construct the health index. A Feature Selection algorithm works by choosing a sub-set of all available Fourier components so that the health index is optimally sensitive to fault conditions of interest (essentially those that have an adverse effect on yield). Typically, the algorithm operates in a step-wise fashion. In this application, Fourier components are added to the health index model one at time. If the augmented health index shows increased sensitivity to all fault conditions, the Fourier component is retained in the index. Otherwise, the component is rejected, and the algorithm advances to try the next component until all components are exhausted. This technique is described by D. L. Massart et al in *Chemometrics: A textbook*, published by Elsevier Science Publishers, Amsterdam. 1988. In the present embodiment an additional constraint is applied to the step-wise algorithm, namely that the addition of each new component minimises the sensitivity to the PM event. The resultant health index is a linear combination of the original Fourier Components of the form:

$$\alpha.C0 + \beta.C1 + \gamma.C2 + \delta.C3 + \ldots$$

where C0, C1, C2, C3, etc. are Fourier Components and $\alpha, \beta, \gamma, \delta \ldots$ etc. are multipliers.

In this example, the algorithm maintains two components in the health index. The others are rejected because they do not add additional sensitivity to the health index, or because they are overly sensitive to the PM event. Thus:

$$\text{Health Index} = \alpha.V2 - \beta.V1$$

Figure 7:
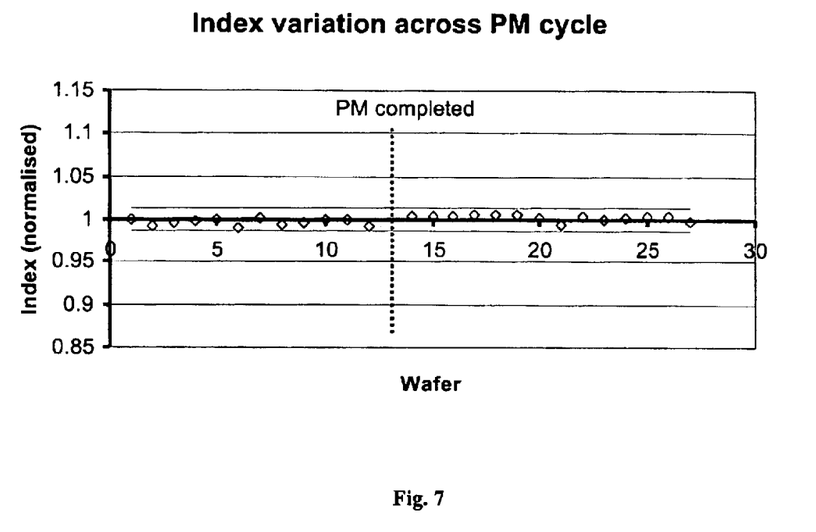
FIG. 7 shows the variation across a PM cycle of a composite health index constructed using Fourier components.

FIG. 7 shows the health index monitored over several wafer lots at two different times in the chamber PM cycle. No faults occur, none are registered. Also note that this parameter is less sensitive to the PM event, and consequently the control limits (dashed lines) derived from this parameter are more constrained. In this embodiment the composite index is designed for a Lam Research 9400 poly-silicon etch tool.

Figure 8:
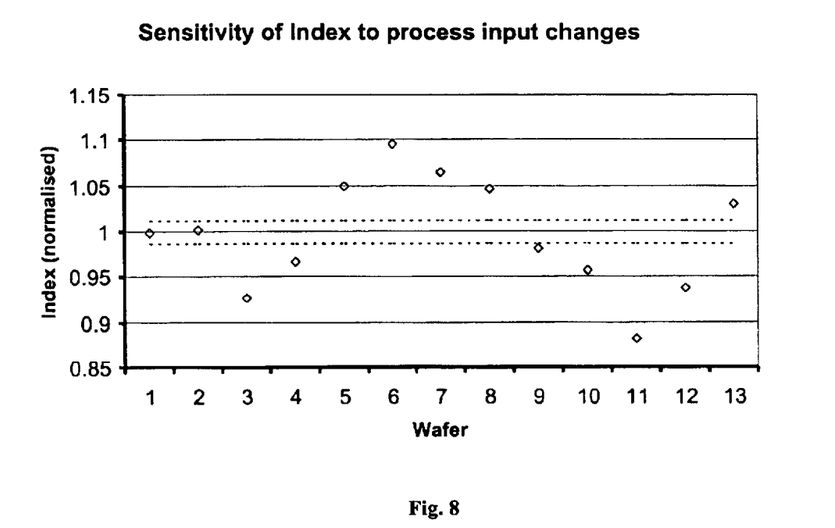
FIG. 8 shows the sensitivity of the composite health index to the induced faults of FIG. 2.

During a subsequent production run, the plasma process is monitored for faults. FIG. 8 shows how the composite health index responds to different induced fault conditions described in FIG. 2. Each of the faults throws the composite index outside pre-assigned control limits. The faults are easily noted and the process can be stopped.

It is to be understood that the changes in the process input parameters which the method is designed to detect are not those such as occur in response to changes in the relevant external input settings; obviously, these can be readily determined. Rather, it is changes which occur despite such input settings remaining nominally unchanged through some fault in the plasma process. For example, the mass flow rate sensor could develop a fault so that the rate of introduction of gas into the chamber varied from the value indicated by the sensor, or the match unit could absorb power so that the delivered RF power was less than that indicated on the power meter associated with the RF source.

The foregoing technique is not be limited to process input parameters. Many other faults occur in plasma process chambers. For example, following regular preventative maintenance, a chamber is stripped and cleaned. Parts may or may not be replaced. As discussed above, it is possible to correlate changes in Fourier components with chamber part lifetime, so that faults in individual parts can be included in the reference data. Furthermore, faults on the substrate itself, due to mis-processing on a previous step can also be included in the technique. In short, the system can be programmed for new failure mechanisms.

Figure 9:
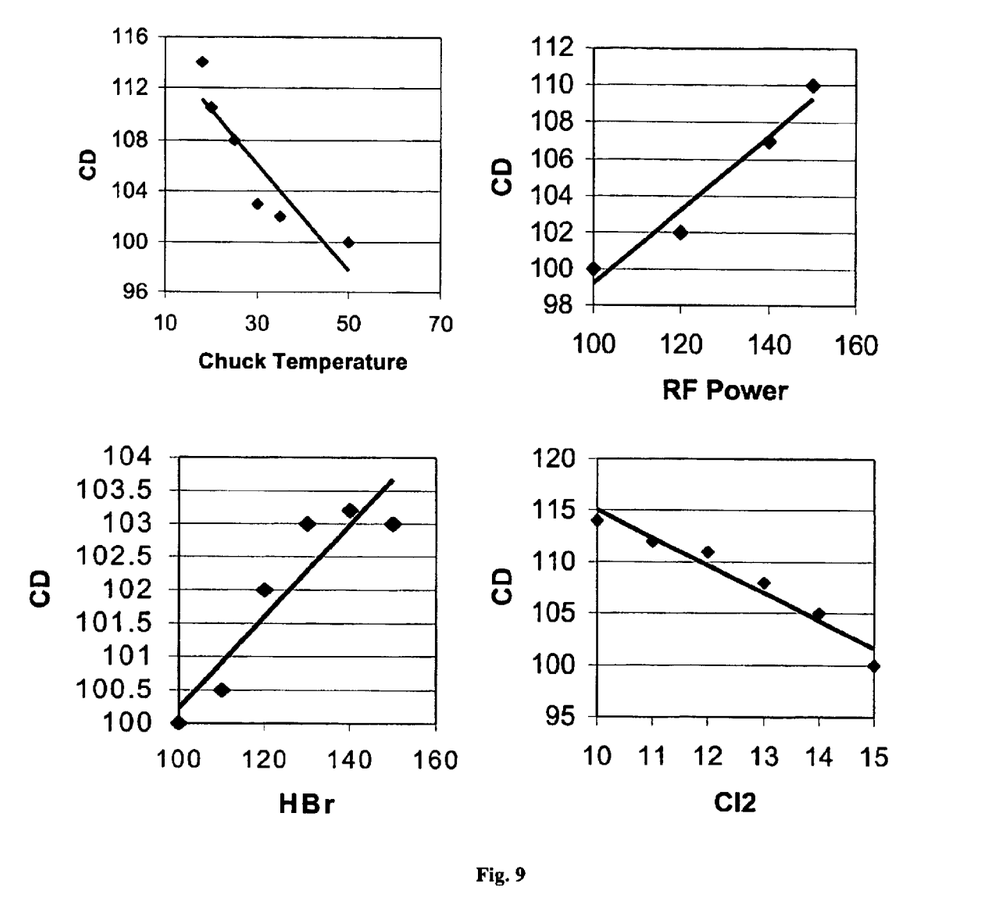
FIG. 9 shows the variation of critical dimension (CD) with process inputs.
Figure 10:
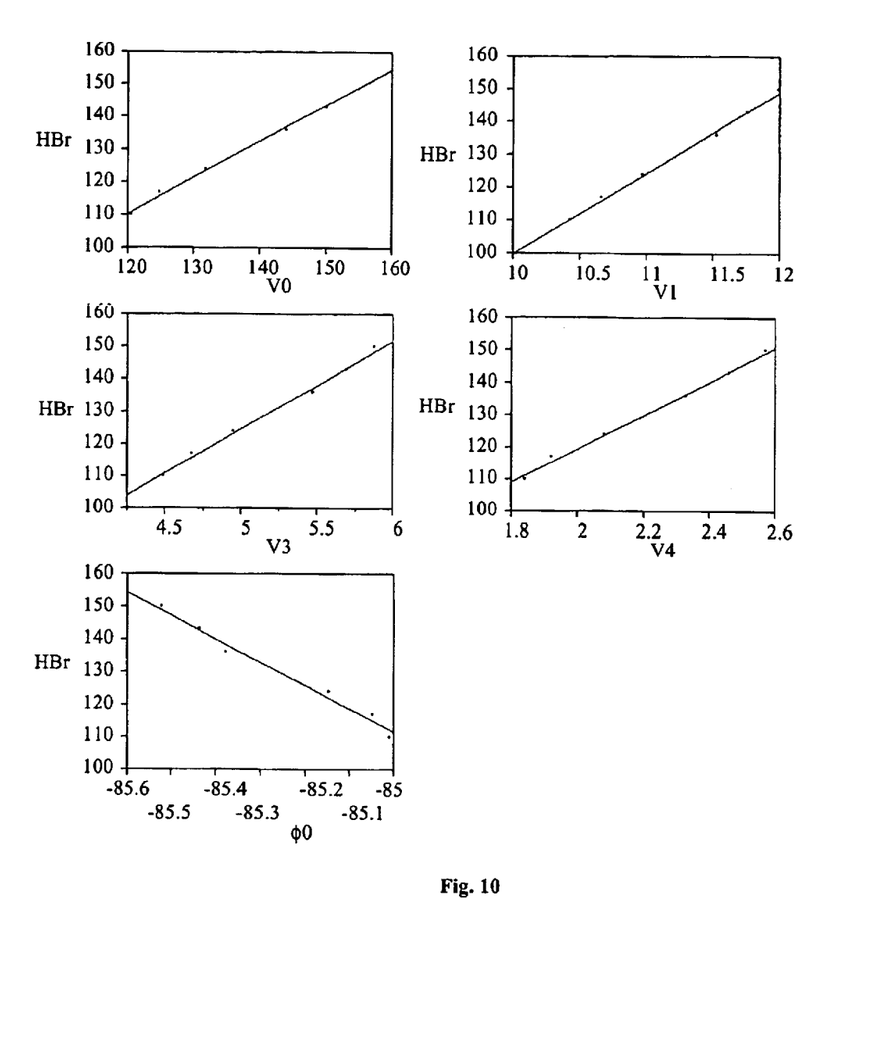
FIG. 10 shows variation of selected Fourier components with a selected CD specific process input.

Another important application of this technique is the optimised detection of particular processing issues. For example, yield is a key driver in the semiconductor industry and there is a constant drive to improve yield while controlling costs. In the design of a silicon chip one of the key performance metrics is driven by the length of the poly-silicon gate, or the CD (critical dimension). It is known that the CD bias (length of gate etch mask to actual etched gate length) is a function of etchant gases such as HBr, $Cl_2$ and $O_2$ as well as substrate temperature and plasma power. By pre-determining what Fourier components are sensitive to, for example, these process inputs, a health index can be designed using the technique outlined herein which will be very sensitive to changes in CD and hence yield. The same can be done for other yield drivers in different processes. FIG. 9 shows an experiment in which CD is measured as these process inputs are varied. Simultaneously, the Fourier components are recorded. FIG. 10 shows the selected Fourier components. Using this data, by the technique described above, an index can be constructed with particular sensitivity to CD variation.

It is to be understood that the technique is not limited to the measurement of 15 Fourier components as described. Any number can be used, provided that there is a sufficient number of independent components to adequately classify the plurality of process inputs and that those chosen are sensitive to said input changes.

It should also be understood that it is not essential to determine the correlation of Fourier components with process input parameters using a Design of Experiments. For example, each of the process inputs can be varied independently while all others remain fixed.

It should also be understood that the process is not necessarily limited solely to the use of the RF Fourier components to define the reference data. It may be advantageous to add other independent sensor inputs which may contribute to the data.

The invention is not limited to the embodiment described herein which may be modified or varied without departing from the scope of the invention.

What is claimed is:

1. A method of fault detection in a plasma process chamber powered by an RF source and subject to periodic standard preventive maintenance events, comprising the steps of:

prior to a production run using a predetermined plasma process, determining the changes in magnitude of a plurality of Fourier components of the RF source resulting from known changes in a plurality of process conditions and constructing a single parameter which is a linear combination of a selected subset of said components, said combination being more sensitive to pre-selected process changes than to said standard preventive maintenance events, running the plasma process during a subsequent production run, and during said production run, monitoring said single parameter to determine if there is a fault in the plasma process.

2. A method as claimed in claim 1, wherein the changes in process conditions include variations in the process input parameters.

3. A method as claimed in claim 1, wherein the changes in process conditions include induced faults in the process.

4. A method as claimed in claim 3, wherein the induced faults include hardware faults.

5. A method as claimed in claim 1, wherein the preselected process changes affect the yield of the process.

6. A method as claimed in claim 1, wherein the Fourier components are those of the voltage, current and phase of the RF power signal.

* * * * *

UNITED STATES PATENT AND TRADEMARK OFFICE
CERTIFICATE OF CORRECTION

PATENT NO. : 6,781,383 B2
DATED : August 24, 2004
INVENTOR(S) : O'Leary et al.

It is certified that error appears in the above-identified patent and that said Letters Patent is hereby corrected as shown below:

<u>Title page,</u>
Item [73], Assignee, "Scientific System Research Limited" should read -- Scientific Systems Research Limited --.

Signed and Sealed this

Twenty-first Day of December, 2004

JON W. DUDAS
*Director of the United States Patent and Trademark Office*